United States Patent [19]
Lou

[11] Patent Number: 6,162,680
[45] Date of Patent: Dec. 19, 2000

[54] METHOD FOR FORMING A DRAM CAPACITOR

[75] Inventor: Chine-Gie Lou, Hsinchu Hsien, Taiwan

[73] Assignee: Worldwide Semiconductor Manufacturing Corp., Hsinchu, Taiwan

[21] Appl. No.: 09/317,132

[22] Filed: May 24, 1999

[51] Int. Cl.[7] .................. H01L 21/8242; H01L 21/20
[52] U.S. Cl. .................. 438/254; 438/253; 438/396; 438/397
[58] Field of Search .................. 438/253, 254, 438/396, 397

[56] References Cited

U.S. PATENT DOCUMENTS

| | | | |
|---|---|---|---|
| 5,240,871 | 8/1993 | Doan et al. | 437/47 |
| 5,545,585 | 8/1996 | Wang et al. | 437/52 |
| 5,817,555 | 10/1998 | Cho | 438/253 |
| 5,851,876 | 12/1998 | Jenq | 438/253 |
| 5,907,774 | 5/1999 | Wise | 438/254 |
| 6,064,085 | 5/2000 | Wu | 257/296 |

*Primary Examiner*—John F. Niebling
*Assistant Examiner*—Jennifer M. Kennedy

[57] ABSTRACT

The method for forming a capacitor in the present invention includes the steps as follows. At first, a multi-layer structure is formed on a semiconductor substrate, and the multi-layer structure is provided to have etching selectivity in etching neighboring layers in the multi-layer structure. A top dielectric layer is then formed on the multi-layer structure. A first opening is defined in the top dielectric layer, and a second opening is defined in the multi-layer structure under the first opening. Next, a wet etch is performed through the second opening to form at least two lateral openings in the multi-layer structure. Following the wet etch, a first conductive layer is formed conformably on the top dielectric layer, on sidewalls of the first opening and the second opening, and filled within the at least two lateral openings. A filling layer is then formed on the substrate, and the filling layer and the first conductive layer on the top dielectric layer are removed. The remained filling layer, the top dielectric layer, and the multi-layer structure are removed to leave a first electrode on the substrate. Finally, an inter-electrode dielectric layer is formed on the first electrode and a second conductive layer is formed on the inter-electrode dielectric layer to finish the formation of a capacitor.

20 Claims, 3 Drawing Sheets

METHOD FOR FORMING A DRAM CAPACITOR

FIELD OF THE INVENTION

The present invention relates to a semiconductor manufacturing process. More specifically, the present invention relates to a method for forming dynamic random memory access (DRAM) capacitor.

BACKGROUND OF THE INVENTION

In last four decades, the semiconductor industry has been developed continuously to fabricate integrated circuits with highly effective and densely packed devices. In the application of integrated circuits, memory chips is one of the most important chips in the application of electronic products. With the fast growth of computer, communication, and consumer electronic devices, the need for high density and low cost memory chips, either volatile memories like DRAMs (dynamic random access memories) and SRAMs (static random access memories) and non-volatile memories like flash memories, is increasing quickly for improving the functional characteristics of the devices.

Typically, a single chip may include more than a million or even a billion devices to expand memory capacity or functional characteristics of integrated circuits. Taking DRAMs as an example, the capacity of a single chip has been raised from 16 megabytes, 64 megabytes to 256 megabytes or even higher capacities.

In general, the construction of a DRAM cell mainly includes an operating transistor and a storage cell composed mainly of a capacitor. For increasing the device density of memory cells in an unit area, the size of the operating transistor and the capacitor must be reduced without damaging the operational characteristics and the storage capacity of the capacitor. Several different methods, such as the re-construction of the shape of the storage electrode and the selection of the materials of the electrode and dielectrics, had been proposed to increase the storage capacity of a small size cell.

In the present stage technology of semiconductor fabrication, dielectrics with high dielectric constant, or namely high k dielectrics, are employed in the fabrication of both volatile and non-volatile memory cells to improve their functional characteristics. High k dielectrics such as barium strontium titanate (BST) and lead zirconate titanate (PZT) are well known to be good candidates for DRAM higher than 4 gigabyte and high density, highly capacitive non-volatile memories.

In addition to the selection of dielectrics, another approach to increase the performance of DRAM cell is by increasing surface area of electrodes to increase storage capacity. One of conventional approaches on increasing the surface area of electrodes is to re-construct the shape of the bottom electrode, in order to increase the surface area with the re-constructed shape like laterally extended fins or upwardly extended crowns. In the development of capacitors for high-density dynamic random access memory cells, various kinds of crown-shaped structures of the capacitor electrode have been proposed to increase the surface area of a single electrode.

However, in the conventional semiconductor fabrication process, the conventional crown shape or fin-like shape are constructed with the combination of conductive parts to form the final structure. Generally, more than one deposition process of conductive layers like doped polysilicon are carried out to respectively form the extended parts of the electrode. The extension of fabrication process with multiple polysilicon depositions generally decrease the throughput and the efficiency of fabricating semiconductor devices. In addition, a conductive electrode formed with the combination of multiple depositions of conductive layers generally has the problems of degradation in conductivity, strength, and reliability under the structure having several contact interfaces between deposited layers.

SUMMARY OF THE INVENTION

The present invention is directed to a method for forming a capacitor for dynamic random access memories. The method proposed herein provides a simplified process for forming the bottom electrode of the capacitor with preferably a single deposition process of the conductive material. A bottom electrode with significantly increased surface area under the crown structure and the multiple-fin structure is provided without the prior art problem of the degradation in conductivity, strength, and reliability under the interfacial problem of deposited layers.

The method for forming a capacitor in the present invention includes the steps as follows. At first, a multi-layer structure is formed on a semiconductor substrate, and the multi-layer structure is provided to have etching selectivity in etching neighboring layers in the multi-layer structure. A top dielectric layer is then formed on the multi-layer structure. A first opening is defined in the top dielectric layer, and a second opening is defined in the multi-layer structure under the first opening. Next, a wet etch is performed through the second opening to form at least two lateral openings in the multi-layer structure.

Following the wet etch, a first conductive layer is formed conformably on the top dielectric layer, on sidewalls of the first opening and the second opening, and filled within the at least two lateral openings. A filling layer is then formed on the substrate, and the filling layer and the first conductive layer on the top dielectric layer are removed. The remained filling layer, the top dielectric layer, and the multi-layer structure are removed to leave a first electrode on the substrate. Finally, an inter-electrode dielectric layer is formed on the first electrode and a second conductive layer is formed on the inter-electrode dielectric later to finish the formation of a capacitor.

In the preferred embodiments, a step of forming a hemispherical silicon grain (HSG) on the first electrode can be further added after the removing step is performed to remove the filling layer, the top dielectric layer, and the multi-layer structure, in order to further increase the capacitance of the capacitor.

BRIEF DESCRIPTION OF THE DRAWINGS

The foregoing aspects and many of the attendant advantages of this invention will become more readily appreciated as the same becomes better understood by referencing the following detailed description, when taken in conjunction with the accompanying drawings, wherein.

DETAILED DESCRIPTION OF THE PREFERRED EMBODIMENT

The present invention proposed a method for fabricating a capacitor, preferably a capacitor for dynamic random access memories (DRAMs). Having a multi-layer structure to serve as a shape defining space, a bottom electrode of capacitor is preferably defined with two or more laterally extended fins and upwardly extended crowns. The multi-layer structure is designed to have etch selectivity between neighboring layers in the multi-layer structure, thus the structure of lateral opening can be defined with a single wet etch. The bottom electrode with multiple fins and crowns is provided preferably with a single deposition of a conductive layer to provide increased surface area and solve the prior art issue of electrode reliability and strength. The capacitor providing increased capacitance for high-density dynamic random access memory is provided with simplified process to increase the process window and raise the yield of memory cell fabrication.

Figure 1:
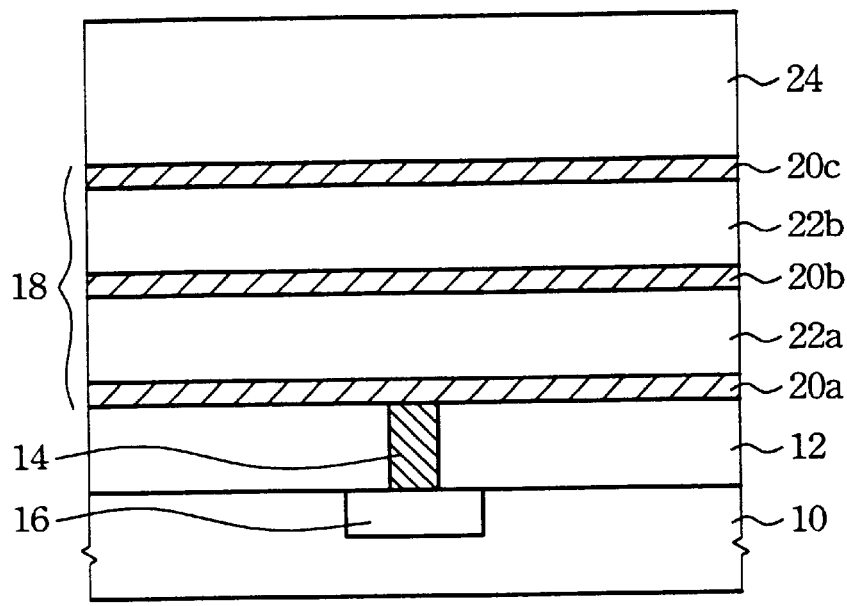
FIG. 1 is a cross sectional view illustrative of forming a multi-layer structure and a top dielectric layer on a semiconductor substrate in accordance with the present invention.

Without limiting the scope of the present invention, the preferred embodiments of the method is described with following illustrations. Referring to FIG. 1, a semiconductor substrate 10 is provided. For a clear and focused illustration of the present invention, the fabrication of only a single capacitor is depicted in the figure, since it is well known for skilled artisans to fabricate the same structure in a great number at the same time on a single wafer.

Typically, the semiconductor substrate 10 has isolations such as field oxide region or trench isolation, and devices like transistors previously formed thereover, in order to be processed with following steps to form an electrode. The substrate is preferably a silicon substrate, and more preferably in a <100> crystallographic orientation, however, other materials and substrates with different crystallographic orientations can also be used alternatively.

As shown in the figure, the substrate 10 is provided to have a bottom dielectric layer 12 thereon an node contact 14 within the bottom dielectric layer 12. The node contact 14 is electrically coupled to a conductive region 16, such as a source junction of a transistor on the substrate 10. In the preferred embodiments, the node contact 14 is formed with conductive materials like doped polysilicon, and a node contact opening can be provided alternatively, for providing a space to fill a conductive material therein when the electrode material is deposited.

At first, a multi-layer structure 18 is formed on the substrate 10, or namely on the bottom dielectric layer 12, and the multi-layer structure 18 is provided to have etching selectivity in etching neighboring layers in the multi-layer structure, in order to provide the lateral openings for forming a bottom electrode with multiple lateral extended fins. As an example, the multi-layer structure 18 may include at least two different dielectric layers to have the difference in the etching rate of a wet etch. In the preferred embodiments, the multi-layer structure 18 includes one, or generally more, stacked structures of a silicon nitride layer and a silicon oxide layer.

As illustrated in FIG. 1, the multi-layer structure 18 has a first silicon nitride layer 20a on the bottom dielectric layer 12, a first silicon oxide layer 22a on the first silicon nitride layer 20a, a second silicon nitride layer 20b on the first silicon oxide layer 22a, a second silicon oxide layer 22b on the second silicon nitride layer 20b, and a third silicon nitride layer 20c on the second silico in oxide layer 22b. The number of dielectric layers and the thickness of each layer can be varied, depending on the needed structure and shape of the bottom electrode of the capacitor. In the case, the first silicon nitride layer 20a, the second silicon nitride layer 20b, and the third silicon nitride layer 20c are formed to have a thickness between about 300 to 1000 angstroms. The first silicon oxide layer 22a and the second silicon oxide layer 22b are formed to have a thickness between about 500 to 2000 angstroms.

Typically, the dielectric layers of silicon nitride or silicon oxide in the multi-layer structure 18 are formed with chemical vapor deposition (CVD), such as plasma enhanced chemical vapor deposition (PECVD) or low pressure chemical vapor deposition (LPCVD) techniques. A top dielectric layer 24 is then formed on the multi-layer structure 18, in order to assist the formation of top extended edges of the bottom electrode of the capacitor. In the preferred embodiments, a silicon oxide layer is employed as the top dielectric layer 24, and can also be formed with chemical vapor deposition (CVD), such as plasma enhanced chemical vapor deposition (PECVD) or low pressure chemical vapor deposition (LPCVD) techniques. In the case, the top dielectric layer 24 can be deposited with a thickness between about 1000 to 6000 angstroms.

Figure 2:
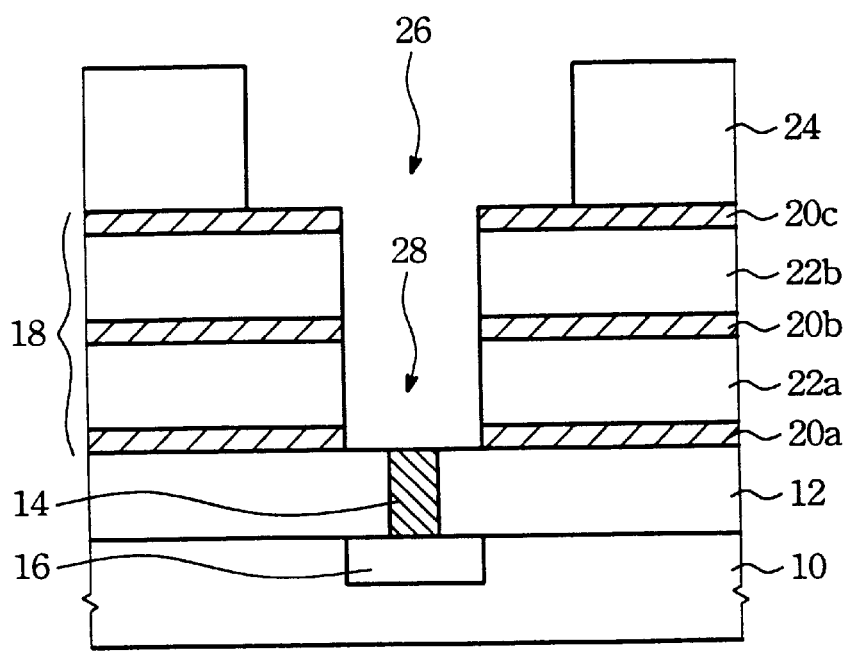
FIG. 2 is a cross sectional view illustrative of defining a first opening in the top dielectric layer and a second opening in the multi-layer structure under the first opening in accordance with the present invention.

Referring to FIG. 2, a first opening 26 extending down to the multilayer structure 18 is then defined in the top dielectric layer 24. By applying a pattern-defining photoresist layer on the top dielectric layer 24, the first opening 26 can be defined by the combination of lithography and etch processes. A anisotropic dry etch, such as a reactive ion etch (RIE), is preferably employed in etching the first opening 26 with less-tapered sidewalls.

After the first opening 26 is defined, a second opening 28 is defined in the multi-layer structure 18. The second opening 28 is defined under the first opening 26 and is extended down to the node contact 14. The second opening 28 is preferably defined in the same manner as the first opening 26 with the application of photoresist layer, and lithography and etch processes. For the stacked structure of several dielectric layers in the multi-layer structure 18, one or moire anisotropic dry etch steps, such as a reactive ion etch (RIE), can be carried out to etch through the multiple layers. The second opening 28 is defined narrower than the first opening 26 in the case. In general, the first opening 26 and the second opening 28 can be defined as a circular region in order to define an electrode in a circular shape.

Figure 3:
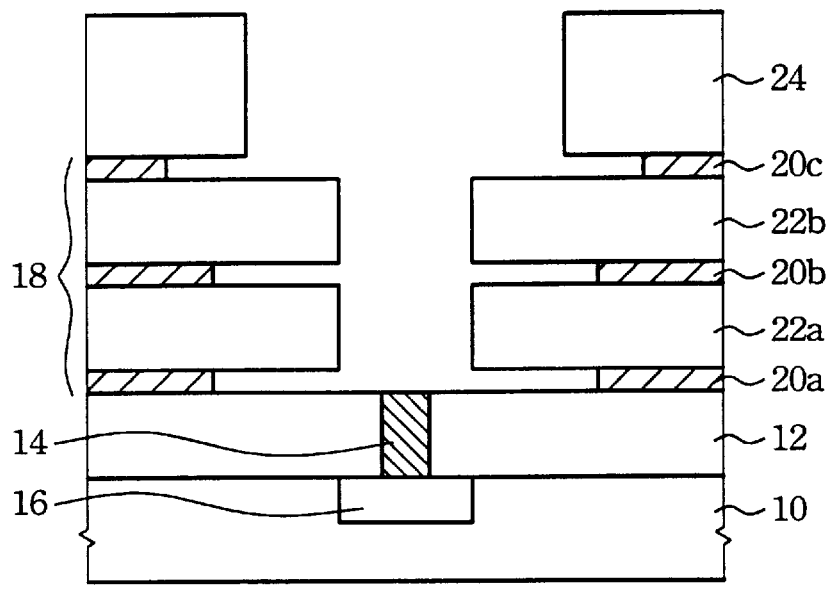
FIG. 3 is a cross sectional view illustrative of performing a wet etch through the second opening to form lateral openings in the multi-layer structure in accordance with the present invention.

Next, turning to FIG. 3, a wet etch is performed through the second opening 28 to form two or more lateral openings in the multi-layer structure 18. In the embodiment of using five stacked layers of three silicon nitride layers and two silicon oxide layers, six lateral openings are formed as shown in the figure. In the preferred embodiments, a wet etch using hot phosphoric solution is carried out to remove portions of silicon nitride layers 20a, 20b and 20c, in order to have the laterally-extended openings extended from the second opening 28. In this embodiment, the composition of the phosphoric acid solution ($H_3PO_4$) is preferably about 86+/−1% $H_3PO_4$ and 14+/−1% $H_2O$. The temperature used in the embodiment is preferably about 150–170° C., and can range between about 140° C. to 180° C.

Figure 4:
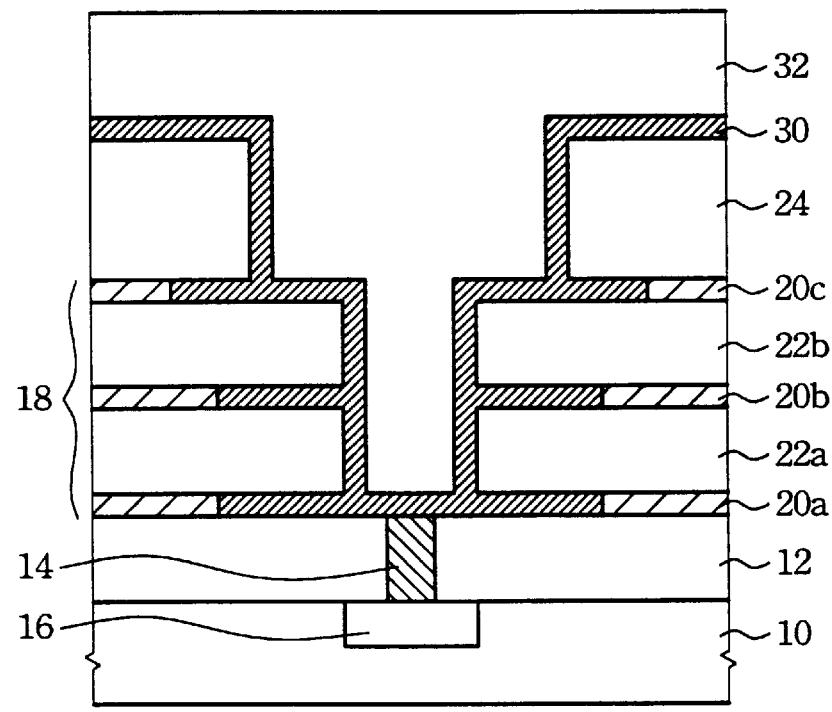
FIG. 4 is a cross sectional view illustrative of forming a first conductive layer and a filling layer on the substrate in accordance with the present invention.

Referring to FIG. 4, a first conductive layer 30 is then formed conformably on the top dielectric layer 24, on sidewalls of the first opening 26 and the second opening 28, and also filled within the lateral openings. In the preferred embodiments, the first conductive layer 30 is preferably a doped amorphous silicon layer. The doped amorphous silicon layer can be formed with low pressure chemical vapor deposition (LPCVD) to provide a better step coverage and hole filling effect, and with in-situ doped dopants to dope the silicon layer. In the case, the first conductive layer 30 of doped amorphous silicon is deposited with a temperature between about 500° C. to 530° C. and a pressure between about 0.2 to 0.7 Torr. The first conductive layer 30 is formed to have electrical coupling with the underlying node contact 14.

Figure 5:
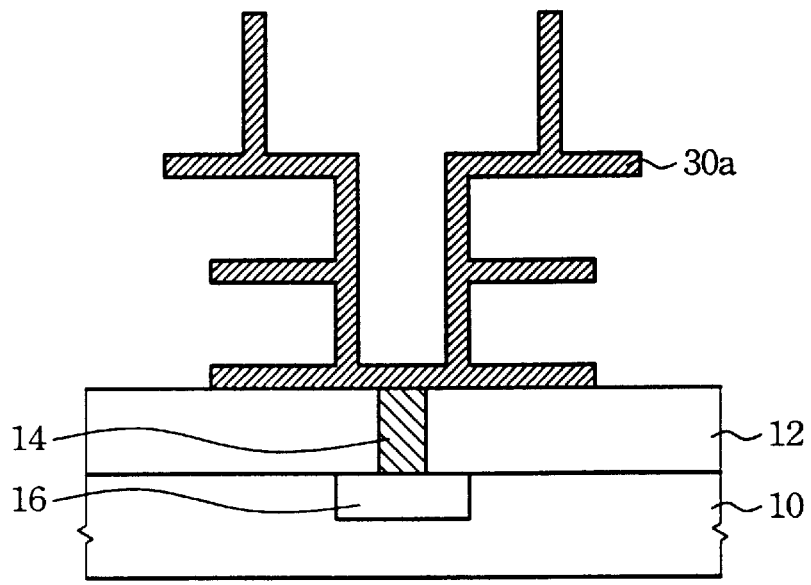
FIG. 5 is a cross sectional view illustrative of removing the filling layer, the top dielectric layer, and the multi-layer structure to leave a first electrode on the substrate in accordance with the present invention.

After the first conductive layer 30 is deposited, a filling layer 32 is formed on the first conductive layer 30 and formed to filled up the first opening 26 and the second opening 28. A photoresist layer can be applied as the filling layer 32 in the case. A removing step is performed to remove the filling layer 32 and the first conductive layer 30 on the top dielectric layer 24 in order to have each individual electrode 30a defined, as shown in FIG. 5. Various typical removing techniques, such as chemical mechanical polish (CMP) and equivalents, are employed in the preferred embodiments to planarize the substrate surface.

A series of removing steps are performed to remove the filling layer 32, the top dielectric layer 24, and the multi-layer structure 18, to leave the bottom electrode 30a on the substrate 10. The removal of the aforementioned layers can be performed with appropriate wet etch processes, respectively for the materials of photoresist, silicon oxide, and silicon nitride.

Therefore, a bottom electrode 30a is formed with aforementioned process to have the structure of laterally extended fins and upwardly extended members. For a cylinder-like shape of the bottom electrode 30a, the laterally extended fins shown in the figure are actually thin circular edges which extend outward, and the upwardly extended members may become a top crown portion of the electrode 30a.

Figure 6:
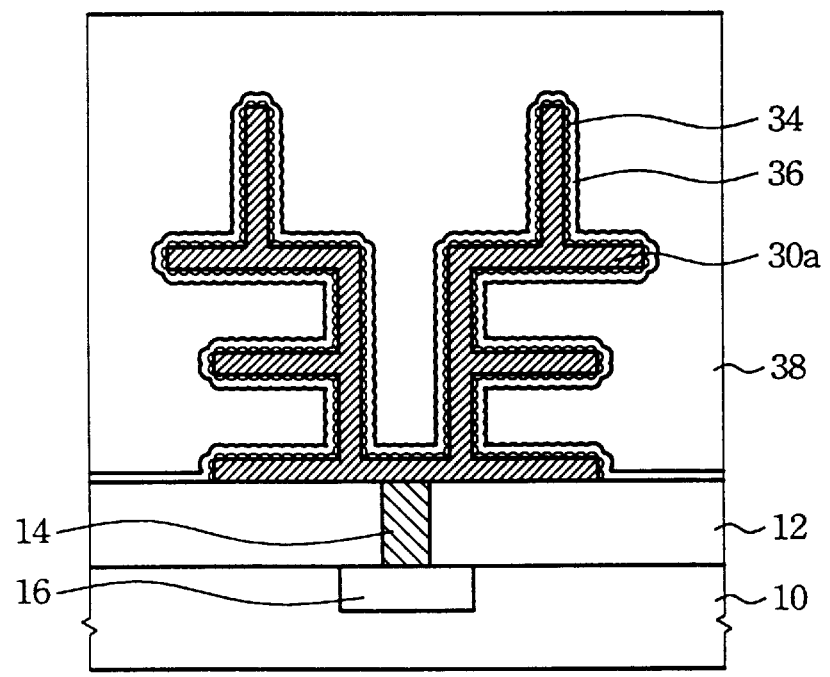
FIG. 6 is a cross sectional view illustrative of forming hemispherical silicon grains (HSG), an inter-electrode dielectric layer, and a second conductive layer on the substrate in accordance with the present invention.

For further increasing the surface area of the electrode 30a, an optional process can be added for forming hemispherical silicon grains (HSG) 34 on the first electrode 30a, as shown in FIG. 6. In the preferred embodiments, the hemispherical silicon grain (HSG) layer 34 can be formed with a selective deposition process, which forms the silicon grains selectively on amorphous silicon surface of the first electrode 30a without forming the silicon grains on a dielectric surface, such as the bottom dielectric layer 12 of silicon oxide. At first, a step of seeding silicon atoms on the first conductive layer 30 is performed, preferably with silicon-based gas such as $SiH_4$ or $Si_2H_6$, under a temperature between about 530° C. to 630° C. and a pressure between about $1 \times 10^{-3}$ to $1 \times 10^{-4}$ Torr. A thermal anneal is then carried out preferably in a high vacuum environment having a pressure between about $1 \times 10^{-8}$ to $1 \times 10^{-9}$ Torr, and a temperature between about 530° C. to 630° C.

Next, an inter-electrode dielectric layer 36 and a second conductive layer 38 for the top electrode of the DRAM cell capacitor are then formed on the bottom electrode 30a in the conventional manner. In this embodiment, a thin dielectric layer 36, such as stacked oxide-nitride-oxide (ONO) film, is formed on the exposed surface of the bottom electrode 30a and the surface of the bottom dielectric layer 12. As is known in the art of DRAM fabrication, the ONO film is reliable over silicon surfaces, and is typically used as a capacitor insulator. Other material, such as oxynitride, $Ta_2O_5$, $TiO_2$, PZT, or BST can be used as the thin dielectric layer 36. A second conductive layer 38 is then deposited over the stack silicon oxide/silicon nitride/silicon oxide layer 36 to serve as an upper plate of the DRAM cell capacitor, thereby forming a dynamic random access memory cell with a capacitor of multiple extended members to increase the surface area. Typically, the second conductive layer 38 is a doped polysilicon layer formed in a similar manlier as the doped amorphous silicon layer 30. Other material, such as metal or silicide, can be used as the conductive layer 38.

As is understood by a person skilled in the art, the foregoing description of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein ,without departing from the spirit and scope of the invention.

What is claimed is:

1. A method for forming a capacitor, said method comprising the steps of:

providing a semiconductor structure having a bottom dielectric layer thereon and a node contact within said bottom dielectric layer;

forming a multi-layer structure on said bottom dielectric layer and said node contact, said multi-layer structure being provided to have etching selectivity in etching neighboring layers in said multi-layer structure;

forming a top dielectric layer on said multi-layer structure;

defining a first opening in said top dielectric layer down to a top area of said multi-layer structure;

after defining said first opening, consecutively defining a second opening in said multi-layer structure under said first opening down to said node contact and said bottom dielectric layer;

performing a wet etch through said second opening to form at least two lateral openings in said multi-layer structure;

forming a first conductive layer conformably on said top dielectric layer, on sidewalls of said first opening and said second opening, and filled within said at least two lateral openings;

forming a filling layer on said substrate;

planarizing a top surface of said substrate to said top dielectric layer;

removing said filling layer, said top dielectric layer, and said multi-layer structure to leave a first electrode having lateral fins and upwardly extended members atop said lateral fins on said substrate;

forming an inter-electrode dielectric layer on said first electrode; and forming a second conductive layer on said inter-electrode dielectric layer.

2. The method of claim 1 further comprising the step of forming hemispherical silicon grains (HSG) on said first electrode after said removing step is performed to removing said filling layer, said top dielectric layer, and said multilayer structure.

3. The method of claim 2, wherein the formation of said hemispherical silicon grains (HSG) comprises the steps of:

seeding silicon atoms on said first conductive layer; and performing a thermal anneal to said substrate.

4. The method of claim 1, wherein said substrate has a bottom dielectric layer underlying said multi-layer structure and an node contact within said bottom dielectric layer, said node contact communicating to said first conductive layer.

5. The method of claim 1, wherein said multi-layer structure comprises at least two dielectric layers of different dielectric materials.

6. The method of claim 5, wherein said multi-layer structure comprises at least one stacked structure having a silicon nitride layer and a silicon oxide layer.

7. The method of claim 5, wherein said multi-layer structure comprises:

a first silicon nitride layer on said substrate;

a first silicon oxide layer on said first silicon nitride layer;

a second silicon nitride layer on said first silicon oxide layer;

a second silicon oxide layer on said second silicon nitride layer; and a third silicon nitride layer on said second silicon oxide layer.

8. The method of claim 7, wherein said wet etch is performed with a phosphorus acid to form said lateral openings by removing portions of said first silicon nitride layer, said second silicon nitride layer, and said third silicon nitride layer.

9. The method of claim 1, wherein said first opening is wider than said second opening.

10. The method of claim 1, wherein said first conductive layer comprises a doped amorphous silicon layer.

11. The capacitor according to claim 1, wherein said inter-electrode dielectric layer is selected from the group consisting of stacked oxide-nitride-oxide (ONO) film, oxynitride, $Ta_2O_5$, $TiO_2$, PZT, and BST.

12. The method of claim 1, wherein said second conductive layer comprises a doped polysilicon layer.

13. A method for forming a capacitor, said method comprising the steps of:

providing a semiconductor structure having a bottom dielectric layer thereon and a node contact within said bottom dielectric layer;

forming a multi-layer structure on said bottom dielectric layer and said node contact, said multi-layer structure comprising:

a first silicon nitride layer on said substrate;

a first silicon oxide layer on said first silicon nitride layer;

a second silicon nitride layer on said first silicon oxide layer;

a second silicon oxide layer on said second silicon nitride layer;

a third silicon nitride layer on said second silicon oxide layer;

forming a top dielectric layer on said multi-layer structure;

defining a first opening in said top dielectric layer down to a top area of said multi-layer structure;

after defining said first opening, consecutively defining a second opening in said multi-layer structure under said first opening down to said node contact and said bottom dielectric layer;

performing a wet etch through said second opening to remove portions of said first silicon nitride layer, said second silicon nitride layer, and said third silicon nitride layer, in order to form at least two lateral openings in said multi-layer structure;

forming a first conductive layer conformably on said top dielectric layer, on sidewalls of said first opening and said second opening, and filled within said at least two lateral openings;

forming a filling layer on said substrate;

planarizing a top surface of said substrate to said top dielectric layer;

removing said filling layer, said top dielectric layer, and said multi-layer structure to leave a first electrode having lateral fins and upwardly extended members atop said lateral fins on said substrate;

forming hemispherical silicon grains (HSG) on said first electrode;

forming an inter-electrode dielectric layer on said hemispherical silicon grains; and forming a second conductive layer on said inter-electrode dielectric layer.

14. The method of claim 13, wherein the formation of said hemispherical silicon grain (HSG) layer comprises the steps of:

seeding silicon atoms on said first conductive layer; and performing a thermal anneal to said substrate.

15. The method of claim 13, wherein said substrate has a bottom dielectric layer underlying said multi-layer structure and an node contact within said bottom dielectric layer, said node contact communicating to said first conductive layer.

16. The method of claim 13, wherein said first conductive layer comprises a doped amorphous silicon layer.

17. The capacitor according to claim 13, wherein said inter-electrode dielectric layer is selected from the group consisting of stacked oxide-nitride-oxide (ONO) film, oxynitride, $Ta_2O_5$, $TiO_2$, PZT, and BST.

18. The method of claim 13, wherein said second conductive layer comprises a doped polysilicon layer.

19. A method for forming a first electrode for a capacitor, said method comprising the steps of:

forming a multi-layer structure on a semiconductor substrate, said multi-layer structure being provided to have etching selectivity in etching neighboring layers in said multi-layer structure;

forming a top dielectric layer on said multi-layer structure;

defining a first opening in said top dielectric layer;

defining a second opening in said multi-layer structure under said first opening;

performing a wet etch through said second opening to form at least two lateral openings in said multi-layer structure;

forming a first conductive layer conformably on said top dielectric layer, on sidewalls of said first opening and said second opening, and filled within said at least two lateral openings;

forming a filling layer on said substrate;

planarizing a top surface of said substrate to said top dielectric layer; and removing said filling layer, said top dielectric layer, and said multi-layer structure to leave said first electrode on said substrate.

20. The method of claim 19 further comprising the step of forming hemispherical silicon grains (HSG) on said first electrode after said removing step is performed to removing said filling layer, said top dielectric layer, and said multi-layer structure.

* * * * *